United States Patent [19]
Jang et al.

[11] Patent Number: 5,985,738
[45] Date of Patent: Nov. 16, 1999

[54] METHOD FOR FORMING FIELD OXIDE OF SEMICONDUCTOR DEVICE USING WET AND DRY OXIDATION

[75] Inventors: Se Aug Jang; Young Bog Kim; Moon Sig Joo; Byung Jin Cho; Jong Choul Kim, all of Ichon, Rep. of Korea

[73] Assignee: Hyundai Electronics Industries Co., Ltd.

[21] Appl. No.: 08/959,205

[22] Filed: Oct. 28, 1997

[30] Foreign Application Priority Data

Oct. 29, 1996 [KR] Rep. of Korea ............... 96-49395

[51] Int. Cl.$^6$ ............................................. H01L 21/762
[52] U.S. Cl. ................................... 438/452; 438/439
[58] Field of Search .................... 438/452, 439–451, 438/453, 297, 298

[56] References Cited

U.S. PATENT DOCUMENTS

| | | | |
|---|---|---|---|
| 4,098,618 | 7/1978 | Crowder et al. | 148/1.5 |
| 4,329,773 | 5/1982 | Geipel, Jr. et al. | 29/571 |
| 4,551,910 | 11/1985 | Patterson | 29/576 W |
| 4,965,221 | 10/1990 | Dennison et al. | 437/70 |
| 4,981,813 | 1/1991 | Bryant et al. | 437/73 |
| 5,024,962 | 6/1991 | Murray et al. | 437/40 |
| 5,057,463 | 10/1991 | Bryant et al. | 437/238 |
| 5,244,843 | 9/1993 | Chau et al. | 437/239 |
| 5,298,451 | 3/1994 | Rao | 437/70 |
| 5,445,975 | 8/1995 | Gardner et al. | 437/10 |
| 5,538,923 | 7/1996 | Gardner et al. | 437/238 |
| 5,637,529 | 6/1997 | Jang et al. | 437/69 |
| 5,661,072 | 8/1997 | Jeng | 438/439 |
| 5,817,581 | 10/1998 | Bayer et al. | 438/770 |

FOREIGN PATENT DOCUMENTS

| | | |
|---|---|---|
| 0 284 456 | 9/1988 | European Pat. Off. . |
| 2 071 911 | 9/1981 | United Kingdom . |
| 2 167 601 | 5/1986 | United Kingdom . |

OTHER PUBLICATIONS

S. Wolf, Silicon Processing for the VLSI Era, vol. 3, Lattice Press, p. 342, 1995.

*Primary Examiner*—Olik Chaudhuri
*Assistant Examiner*—Daniel Mao
*Attorney, Agent, or Firm*—Thelen Reid & Priest, L.L.P.

[57] ABSTRACT

A method for forming a field oxide of a semiconductor device is disclosed, which takes advantage of wet oxidation at an early stage of field oxidation to prevent the ungrowth of field oxide and dry oxidation at a later stage of field oxidation to make the slope of field oxide positive, thereby improving the production yield and the reliability of semiconductor device.

10 Claims, 10 Drawing Sheets

METHOD FOR FORMING FIELD OXIDE OF SEMICONDUCTOR DEVICE USING WET AND DRY OXIDATION

BACKGROUND OF THE INVENTION

1. Field of the Invention

The present invention relates, in general, to a method for forming a field oxide of a semiconductor device and, more particularly, to a method by which the ungrowth of field oxide is prevented and a gate oxide enhanced in reliability can be produced.

2. Description of the Prior Art

In order to better understand the background of the invention, a description will be given of the conventional method of forming a field oxide in conjunction with figures.

Referring to FIG. 1, there are illustrated processes of forming a field oxide, according to the conventional technique.

First, as shown in FIG. 1a, prepared a semiconductor substrate 1 is over which a pad oxide 2 and a first nitride 3 are sequentially formed, through which the first nitride 3 with a mask at a predetermined field region is etched. At this time, the first nitride 3 is over-etched in such a way that the semiconductor substrate 1 is recessed to a predetermined thickness, for example, about 50–100 Angstrom.

On the resulting structure a second nitride 4 is then deposited, as shown in FIG. 1b.

Subsequently, the whole surface of the second nitride 4 is subjected to dry etching without any mask, to form a nitride spacer 4', as shown in FIG. 1c.

A further dry etching process is executed to recess the exposed region of the semiconductor substrate 1, as shown in FIG. 1d. At this time, since the etching selection ratio of silicon to nitride has a certain value, the nitride 3 of the active region, besides the semiconductor substrate 1 of the field region, is partially etched to create nitride residues R, which are collected in the recess. At a site with a relatively small area ratio of active region to field region, such as the cell region of a memory device, the nitride residues are produced at a small amount. But, a significant amount of the nitride residues is produced in a site which has a much larger area of active region than that of field region, for example, at a peripheral circuit region. The nitride residues R produced in the silicon recess etch process are either released or redeposited on the gorge shape field region. As an example of the latter case, because such residues occur at a significant amount at a field region of a peripheral circuit site, part of the residues remain on the bottom of the field region.

FIG. 1e is a cross section after an additional dry etch is performed to remove the residues. However, as seen, the nitride residues are not completely removed by the additional etch but remain thin and partial.

When field oxidation is applied under this state, the following properties appear depending on oxidation conditions. Herein, because it takes too much time for dry oxidation, the properties are those which are obtained on the assumption that the field oxidation is executed in a manners only.

When a part of the nitride residues R remain, a wet field oxidation using hydrogen and oxygen allows the normal growth of a field oxide 5 as shown in FIG. 2a. This is because wet oxidation has an excellent ability to oxidize nitride components.

When a dry field oxidation using oxygen alone is carried out, the field oxide thus obtained has an abnormal shape, owing to the residues, in that the field oxide does not grow at the central portion, as shown in FIG. 2b. This is attributed to the fact that dry oxidation is far inferior to wet oxidation in oxidizing the nitride residues R.

However, at a site with a large ratio of active region to field region, even dry field oxidation can make the field oxide grow normally because there are no nitride residues, as shown in FIG. 2c.

FIG. 3 illustrates different points in the shape of the field oxides which are formed in wet and dry field oxidation manner.

FIGS. 3a and 3b show the field oxides which are obtained by carrying out a wet oxidation process at a temperature of 950° C. and 1,100° C., respectively, while the field oxide of FIG. 3c is obtained by carrying out a field oxidation at a temperature of 1,100° C. in a dry manner. As seen, while the field oxide under a nitride spacer has a negative slope at such a low temperature of 950° C. Even at a relatively high temperature of 1,100° C., the slope of the field oxide obtained becomes near zero. In the case that the slope of the field oxide is negative or zero, when a gate oxide is formed after the removal of the nitrides 3 and 4 and a sacrificial oxidation process, an electric field is focused on the boundary between the field oxide and the gate oxide, leading to a degradation of the reliability of the gate oxide.

In FIG. 4, the reliability of the gate oxide obtained under conventional wet field oxidation is shown. As shown in FIG. 4, the reliability is poor because the slope of the field oxide is negative or zero.

Dry field oxidation at 1,100° C. gives a positive slope to the field oxide 5 under a nitride spacer, as shown in FIG. 3c. In this case, the phenomenon where an electric field is focused on the boundary at which the field oxide meets the gate oxide is prevented.

As afore illustrated, carrying out dry field oxidation in the presence of the nitride residues, by-products which are produced in a significant amount in a large active region-to-field region site such as a peripheral circuit region when forming a field oxide, results in abnormally growing the field oxide at the center of the field region. Further, when the conventional wet field oxidation process is executed, the field oxide has a negative or zero slope at the boundary to the active region, degrading the properties of the gate oxide.

SUMMARY OF THE INVENTION

Therefore, it is an object of the present invention to overcome the above problems encountered in prior arts and to provide a method for forming a field oxide of a semiconductor device which takes advantage of wet oxidation at an early stage of field oxidation to prevent the ungrowth of field oxide and dry oxidation at a later stage of field oxidation to make the slope of field oxide positive, thereby improving the production yield and the reliability of semiconductor devices.

In accordance with the present invention, the above object could be accomplished by providing a method for forming a field oxide of a semiconductor device, comprising the steps of: creating a pad oxide and a first nitride, in sequence, over a semiconductor substrate; selectively etching with a mask at a field region to remove the nitride as well as recess the semiconductor substrate to a predetermined depth; depositing a second nitride over the resulting structure; etching the second nitride to form a nitride spacer at the side wall which the recessed semiconductor substrate and the selectively etched nitride both offer; subjecting the semiconductor substrate to dry etch to recess it to a predetermined depth, said nitride spacer serving as an etched barrier; and carrying out field oxidation in a combination manner of wet oxidation and dry oxidation.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1A:
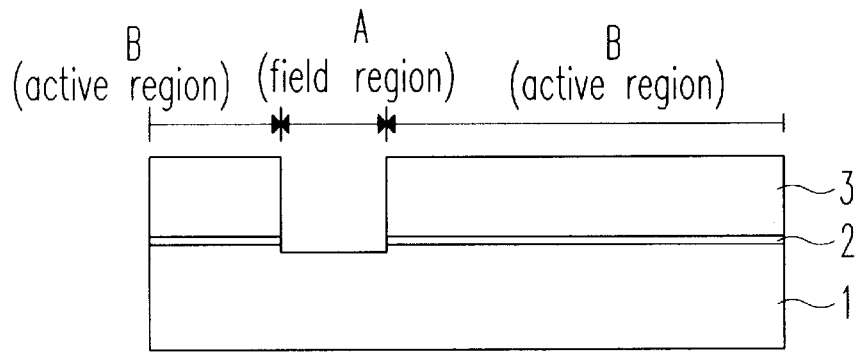
FIGS. 1a to 1e are schematic cross sectional views showing a conventional method for forming a field oxide of a semiconductor device.
Figure 1B:
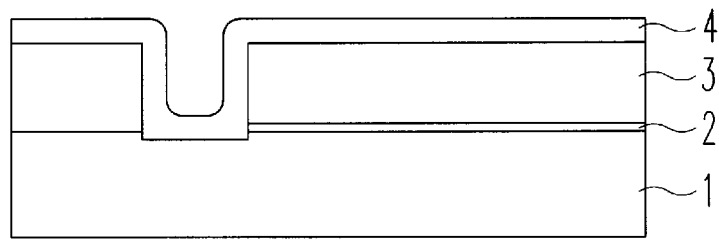
Figure 1C:
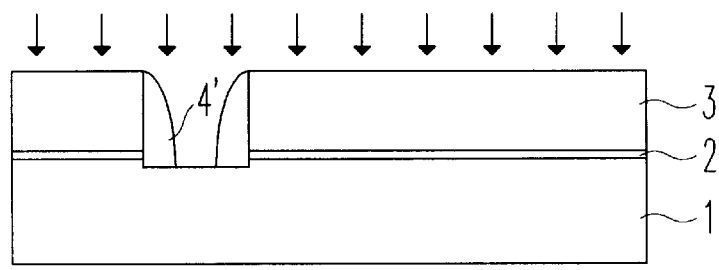
Figure 1D:
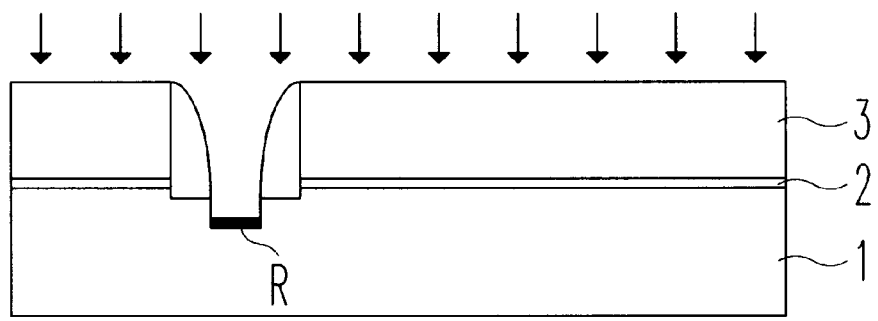
Figure 1E:
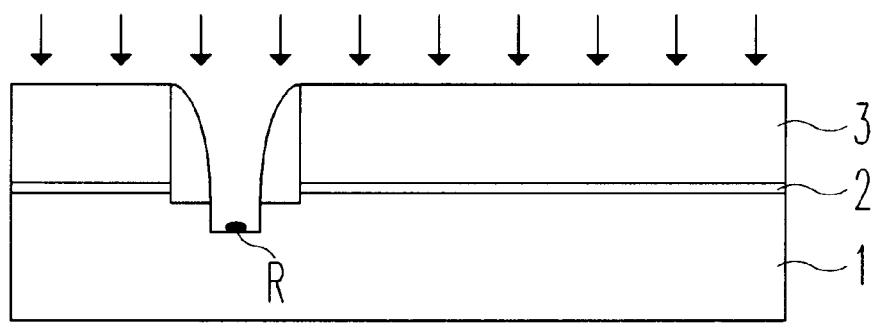
Figure 2A:
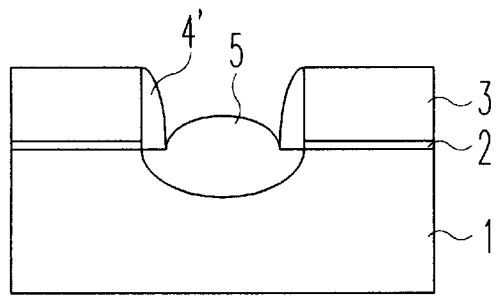
FIG. 2a is a schematic cross sectional view showing a field oxide grown in a peripheral circuit region when carrying out conventional field oxidation in a wet manner.
Figure 2B:
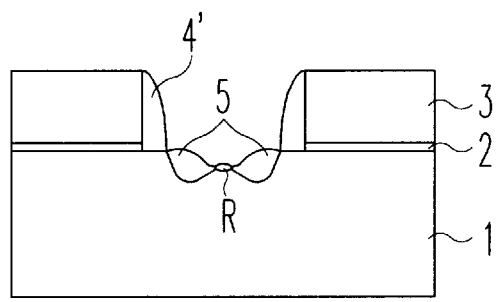
FIG. 2b is a schematic cross sectional view showing a field oxide grown in a peripheral circuit region when carrying out conventional field oxidation in a dry manner.
Figure 2C:
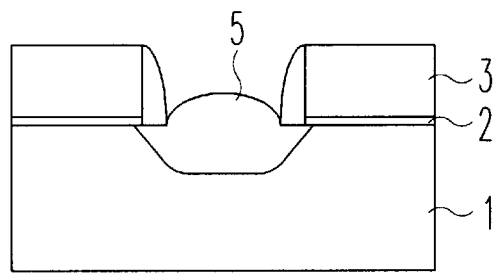
FIG. 2c is a schematic cross sectional view showing a field oxide grown in a cell region when carrying out conventional field oxidation in a dry manner.
Figure 3A:
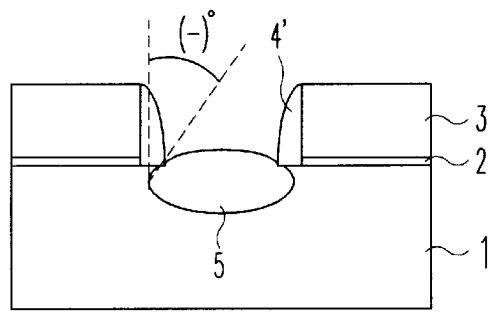
FIG. 3a is a schematic cross sectional view showing a field oxide after field oxidation is carried out at 950° C. in a wet manner.
Figure 3B:
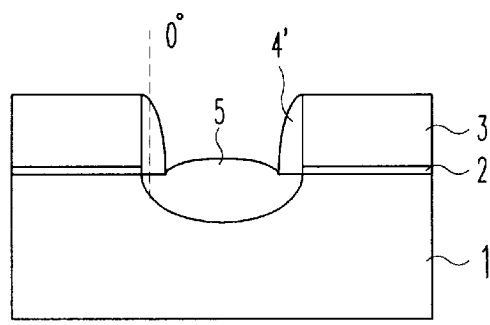
FIG. 3b is a schematic cross sectional view showing a field oxide after field oxidation is carried out at 1,100° C. in a wet manner.
Figure 3C:
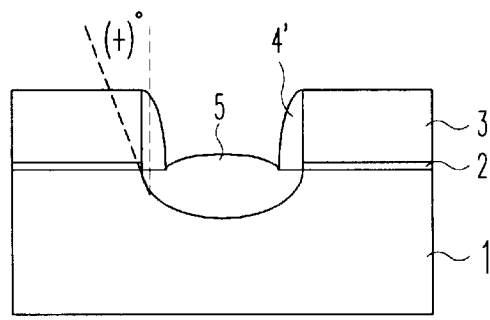
FIG. 3c is a schematic cross sectional view showing a field oxide after field oxidation is carried out at 1,100° C. in a dry manner.
Figure 4:
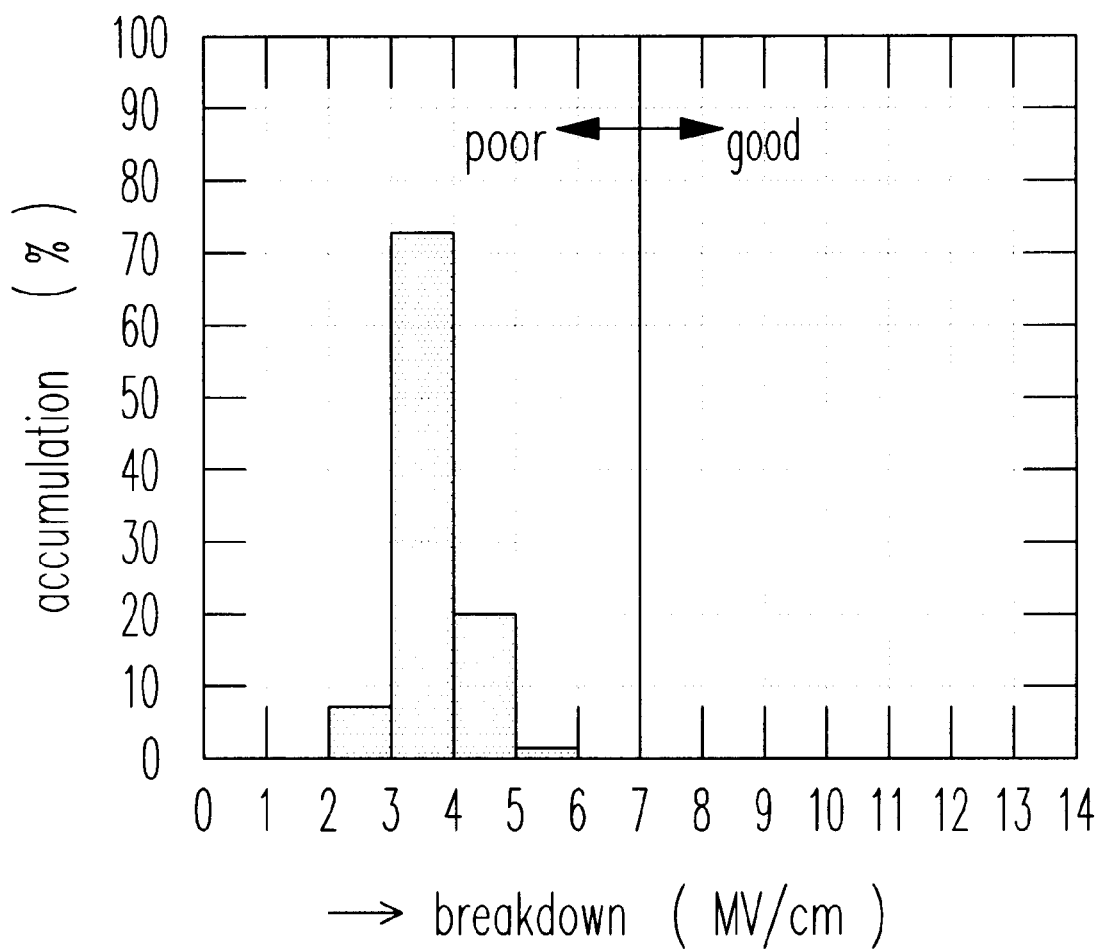
FIG. 4 shows the degradation of gate oxide's degradation when conventional field oxidation is carried out in a wet manner.

The application of the preferred embodiments of the present invention is best understood with reference to the accompanying drawings, wherein like reference numerals are used for like and corresponding parts, respectively.

Referring to FIG. 5, a method for forming a field oxide, according to the present invention is shown.

Figure 5A:
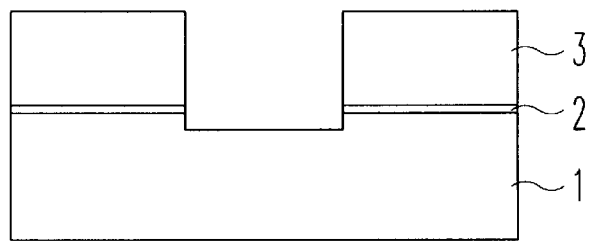
FIGS. 5a to 5g are cross sectional views showing a method for forming a field oxide of a semiconductor device, according to the present invention.

First, as shown in FIG. 5a, a semiconductor substrate 1 is prepared over which a pad oxide 2 and a first nitride 3 are sequentially formed, followed by photoetching the first nitride 3 at a predetermined field region. At this time, the first nitride 3 is over-etched in such a way that the semiconductor substrate 1 is recessed to a predetermined thickness, for example, about 50–100 Angstrom.

Figure 5B:
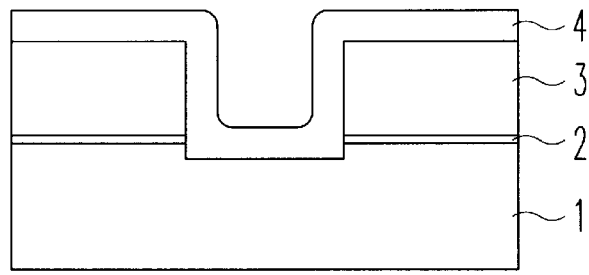

FIG. 5b is a cross section after a second nitride 4 is deposited entirely over the resulting structure.

Figure 5C:
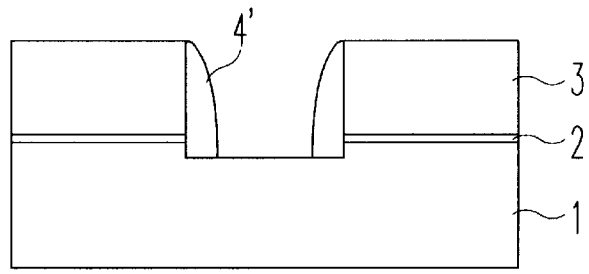

Subsequently, the second nitride 4 is subjected to whole surface dry etching without using any mask, to form a nitride spacer 4' at the side wall of the exposed semiconductor substrate 1 and the first nitride 3, as shown in FIG. 5c.

Figure 5D:
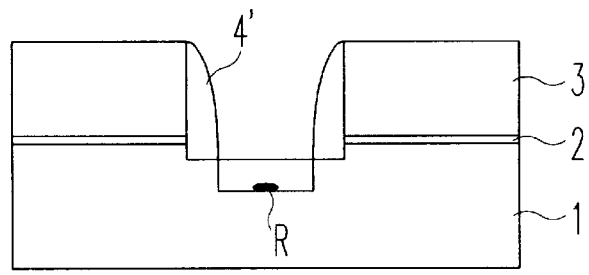

FIG. 5d is a cross section after the exposed semiconductor substrate 1 is recessed to a certain depth by dry etch with the nitride space 4' serving as an etched barrier. At this time, the first nitride over the active region is partially etched to produce nitride residues R, which are collected in the recess formed.

Figure 5E:
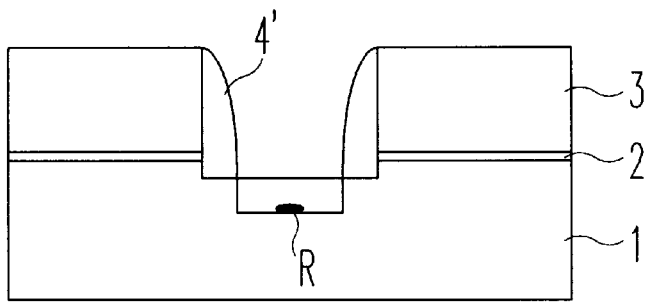

FIG. 5e is a cross section after a further dry etching is applied to the nitride. At this time, in order to accomplish a minimal loss of the nitride spacer 4' as well as a maximal removal of the nitride residues R, the etching is performed for such a controlled time that a thickness of about 100–300 Angstrom is removed.

Figure 5F:
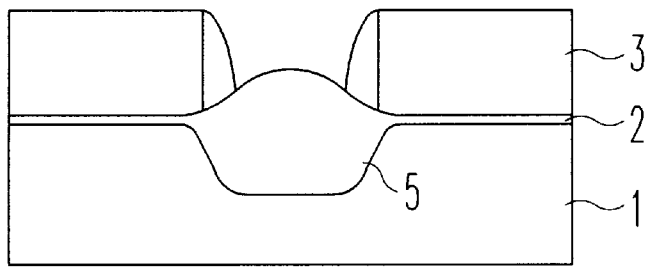

FIG. 5f is a cross section after field oxidation is performed in a combination of a wet manner and a dry manner, to form a field oxide 5.

Figure 5G:
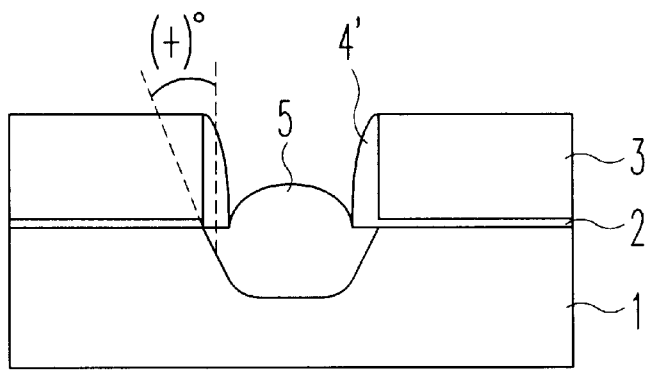

As shown in FIG. 5g, the field oxide 5 has a positive slope.

Figure 6:
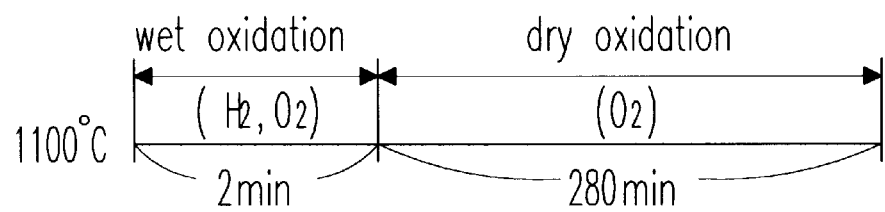
FIG. 6 is an example of growing a field oxide to 3,000 Angstrom at 1,100° C.

The field oxidation may be performed under various conditions and one example is suggested in FIG. 6. According to this example, the field oxidation is carried out at the objective temperature, 1,100° C. in order to obtain a field oxide 3,000 Angstrom thick. For the moment, field oxide is grown to a thickness of 1,000 Angstrom by carrying out a wet field oxidation manner with hydrogen and oxygen for the initial 2 min. During this wet oxidation, the nitride residues R which may remain in the field region of a peripheral circuit, which is a site having a much larger active region area than field region area, are completely oxidized; however, the field oxide has a slope of zero or minus (upon field oxidation at 950° C.). Thereafter, a further field oxidation is made for a predetermined time, for example, about 280 min in a dry oxidation manner using oxygen only, to grow the field oxide up to 3,000 Angstrom. Herein, the thickness ratio of the wet oxide to the dry oxide is exemplified at 1:2, but may range from 1:2 to 2:1 in accordance with the present invention.

If the wet field oxidation is carried out following the dry field oxidation, the above-mentioned effects do not occur. The wet field oxide and the dry field oxide may each grow at different temperatures. For instance, the wet field oxidation may be performed at 950° C. and the dry field oxidation at 1,100° C. (See FIG. 6).

In accordance with another embodiment of the present invention, after such a wet field oxidation is applied for a part of the field oxide and a dry field oxidation for the other part as illustrated above, the wafer is exposed to the air and then a further dry field oxidation is executed.

Figure 7:
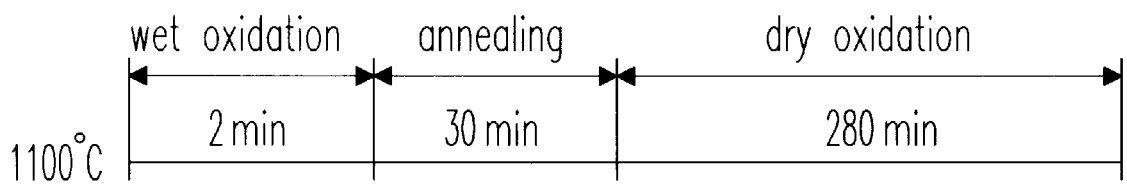
FIG. 7 is another recipe of a recipe for growing a field oxide to 3,000 Angstrom at 1,100° C.

FIG. 7 shows another example of the field oxidation, according to the present invention. This aims to overcome a field oxide thinning phenomenon, a phenomenon in which a field oxide grows more thickly at a narrow field region than at a wide field region, as well as obtains the aforementioned advantages. The thinning of the field oxide is believed to be attributed to the stress grown in the field oxide. Thus, it must be relieved. The field oxidation of FIG. 7 comprises growing a field oxide to 1,000 Angstrom in a wet manner at 1,100° C. and annealing for 30 min in a nitrogen atmosphere before a dry oxidation process, to relieve the stress grown in the field oxide 1,000 Angstrom thick. In result, a thicker field oxide grows in a narrow region during a subsequent dry field oxidation, improving the field oxide thinning phenomenon.

As in FIG. 6, the thickness ratio of the wet oxide to dry oxide is preferably 1:2 but may be controlled depending on individual case conditions. The wet field oxide and the dry field oxide may each grow at different temperatures. For instance, the wet field oxidation may be performed at 950° C. and the dry field oxidation at 1,100° C.

Figure 8:
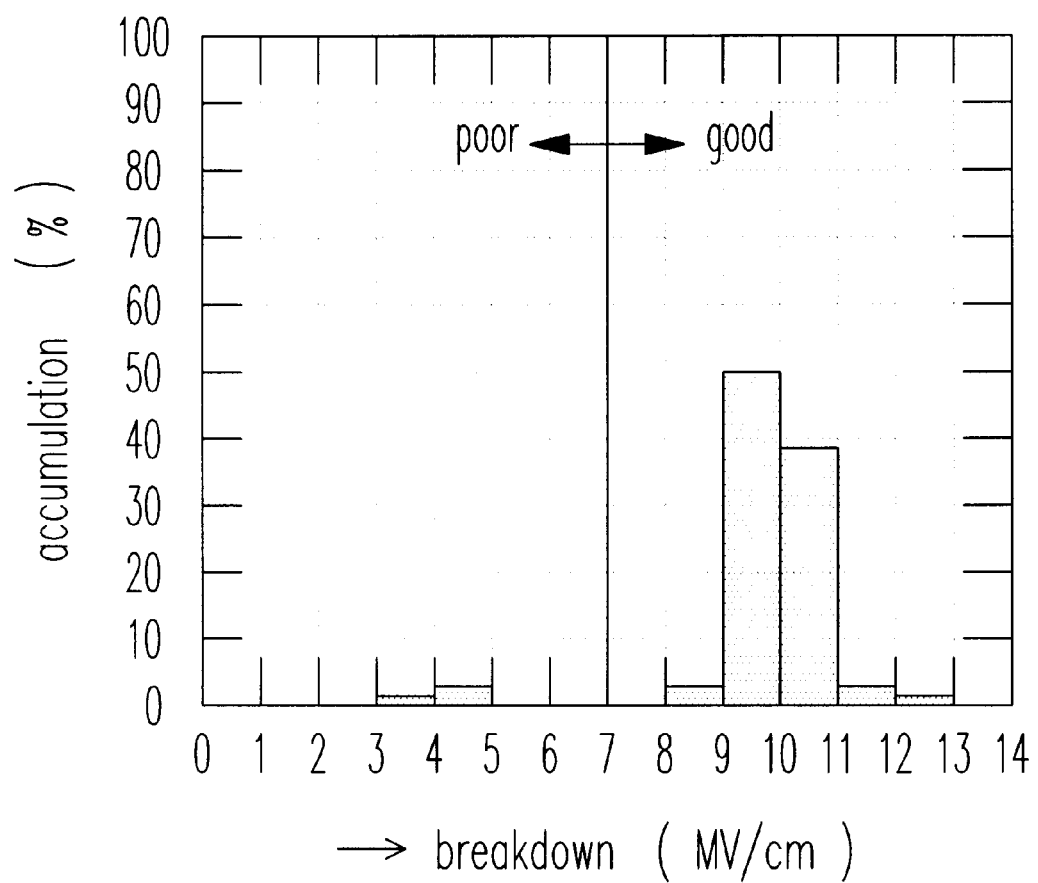
FIG. 8 shows an improvement in the reliability of gate oxide upon field oxidation according to the present invention.

With reference to FIG. 8, there is data demonstrating that when carrying out a field oxidation according to the present invention, the reliability of the field oxide is improved. That is, the field oxide is made to have a positive slope and thus, as much as 95% or more of the total dies show excellent voltage at the break.

Figure 9:
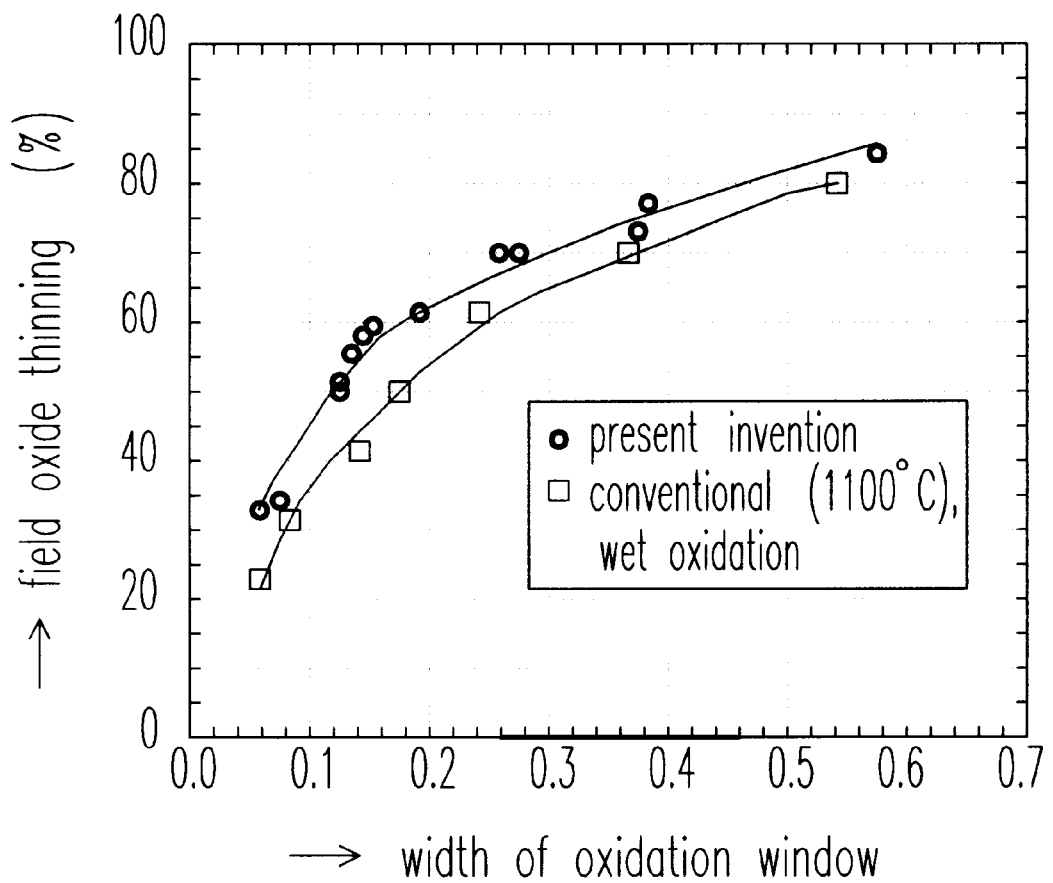
FIG. 9 shows a field oxide thinning phenomenon in the conventional technique when being compared with the invention.

FIG. 9 shows a comparison of the field oxide thinning between a conventional technique and the present invention, demonstrating that the invention is improved 5–10% in the field oxide thinning.

The present invention is not limited to such a technique as illustrated in FIG. 1 but can be applied for various forming techniques of element-isolating film by which a semiconductor substrate is thermally oxidized to form a field oxide. In particular, in the case where the field oxidation of the invention is carried out after recessing a semiconductor substrate, a maximal effect can be obtained.

As described hereinbefore, at an early stage of a field oxidation process for forming a field oxide, a wet oxidation manner is taken to normally grow a part of the field oxide even in a peripheral circuit region and at a later stage, and a dry oxidation manner is used to grow the field oxide to a predetermined thickness and to make the slope of the field oxide positive. When a gate oxide is formed, for example, ordinarily after the removal of an insulating film, e.g. a nitride and a sacrificial oxidation process, an electric field can be prevented from being concentrated on the boundary at which the field oxide meets the gate oxide, so that the gate oxide is improved in properties including reliability.

The present invention has been described with the above illustrations, and it is to be understood the terminology used is not intended to be limited by the description.

Many modifications and variations of the present invention are possible in light of the above principles. Therefore, it is to be understood that within the scope of the appended claims, the invention may be practiced otherwise than as specifically described.

What is claimed is:

1. A method for forming a field oxide of a semiconductor device, comprising the steps of:

creating a pad oxide and a first nitride, in sequence, over a semiconductor substrate;

selectively etching with a mask at a field region to remove the nitride as well as recess the semiconductor substrate to a predetermined depth;

depositing a second nitride over the resulting structure;

etching the second nitride to form a nitride spacer at the side wall which the recessed semiconductor substrate and the selectively etched nitride both offer;

subjecting the semiconductor substrate to dry etch to recess it to a predetermined depth, said nitride spacer serving as an etched barrier; and carrying out field oxidation in a combination manner of wet oxidation and dry oxidation, wherein the wet oxidation is performed before the dry oxidation, and the resulting field oxide has a positive slope.

2. A method in accordance with claim 1, wherein the semiconductor substrate has a recess ranging, in depth, from 50 to 100 Angstrom.

3. A method in accordance with claim 1, wherein said wet oxidation and said dry oxidation are carried out at the same temperature.

4. A method in accordance with claim 1, wherein said wet oxidation and said dry oxidation each are carried out at different temperatures.

5. A method in accordance with claim 3, wherein said wet oxidation and said dry oxidation are carried out at 900–1,200° C.

6. A method in accordance with claim 1, wherein the field oxide are formed by the wet oxidation and the dry oxidation using a residue each produced in a silicon recess etch process.

7. A method in accordance with claim 1, wherein said combination manner further comprises an annealing process subsequent to the wet oxidation.

8. A method in accordance with claim 7, wherein said annealing process is carried out at a temperature of 1,000–1,200° C. in a nitrogen atmosphere.

9. A method in accordance with claim 1, wherein said field oxide ranges, in thickness ratio of wet oxide to dry oxide, from 1:2 to 2:1.

10. The method of claim 1 wherein the dry oxidation is conducted for about 280 minutes, using oxygen only, to grow the field oxide up to 3,000 Angstroms.

* * * * *